US011328942B1

(12) United States Patent
Wallin et al.

(10) Patent No.: US 11,328,942 B1
(45) Date of Patent: May 10, 2022

(54) LIQUID CRYSTALLINE ELASTOMER FOR PICK AND PLACE OF SEMICONDUCTOR DEVICES

(71) Applicant: Facebook Technologies, LLC, Menlo Park, CA (US)

(72) Inventors: Thomas John Farrell Wallin, Redmond, WA (US); Yigit Mengue, Kirkland, WA (US); Pooya Saketi, Cork (IE); Ali Sengül, Zurich (CH); Nicholas Roy Corson, Woodinville, WA (US); Katherine Healy, Redmond, WA (US); Remi Alain Delille, Cork (IE); Oscar Torrents Abad, Cork (IE); Daniel Brodoceanu, Cork (CO); Robert Manson, Seattle, WA (US); Leif-Erik Sharif Simonsen, Kirkland, WA (US)

(73) Assignee: Facebook Technologies, LLC, Menlo Park, CA (US)

(*) Notice: Subject to any disclaimer, the term of this patent is extended or adjusted under 35 U.S.C. 154(b) by 430 days.

(21) Appl. No.: 16/566,808

(22) Filed: Sep. 10, 2019

(51) Int. Cl.
*H01L 21/67* (2006.01)
*H01L 25/075* (2006.01)

(52) U.S. Cl.
CPC .... *H01L 21/67144* (2013.01); *H01L 25/0753* (2013.01)

(58) Field of Classification Search
CPC ............... H01L 21/67; H01L 21/6835; H01L 2221/68304; H01L 2221/68368
See application file for complete search history.

(56) References Cited

U.S. PATENT DOCUMENTS

| | | | | |
|---|---|---|---|---|
| 9,159,635 | B2* | 10/2015 | Elolampi | H01L 23/4985 |
| 10,796,938 | B2* | 10/2020 | Radauscher | H05K 1/111 |
| 11,107,948 | B1* | 8/2021 | Menguc | H01L 21/6835 |
| 2010/0123268 | A1* | 5/2010 | Menard | H01L 24/75 |
| | | | | 264/293 |
| 2012/0241919 | A1* | 9/2012 | Mitani | H01L 21/6835 |
| | | | | 257/623 |
| 2014/0159043 | A1* | 6/2014 | Sakariya | H01L 25/0753 |
| | | | | 257/59 |
| 2016/0155892 | A1* | 6/2016 | Li | H01L 24/95 |
| | | | | 257/89 |
| 2017/0236807 | A1* | 8/2017 | Hwang | H01L 33/0075 |
| | | | | 257/90 |
| 2019/0207043 | A1* | 7/2019 | Yonkee | H01L 21/02579 |
| 2019/0237347 | A1* | 8/2019 | Saketi | H01J 37/321 |

* cited by examiner

*Primary Examiner* — Andrew J Coughlin
(74) *Attorney, Agent, or Firm* — Fenwick & West LLP

(57) ABSTRACT

A pick-up head assembly comprises a body of a liquid crystalline elastomer (LCE) that undergoes a reversible expansion when exposed to a first frequency of light and contracts when exposed to a second frequency of light. Selective portions of the LCE in the pick-up head assembly are irradiated with the first frequency to cause an expansion in the selective portions. The adhesive forces of the expanded portions of the LCE are used to pick-up semiconductor devices from a first substrate. The semiconductor devices are placed on a second substrate by exposing the expanded portions of the LCE to the second frequency of light, causing the expanded portions to contract.

20 Claims, 10 Drawing Sheets

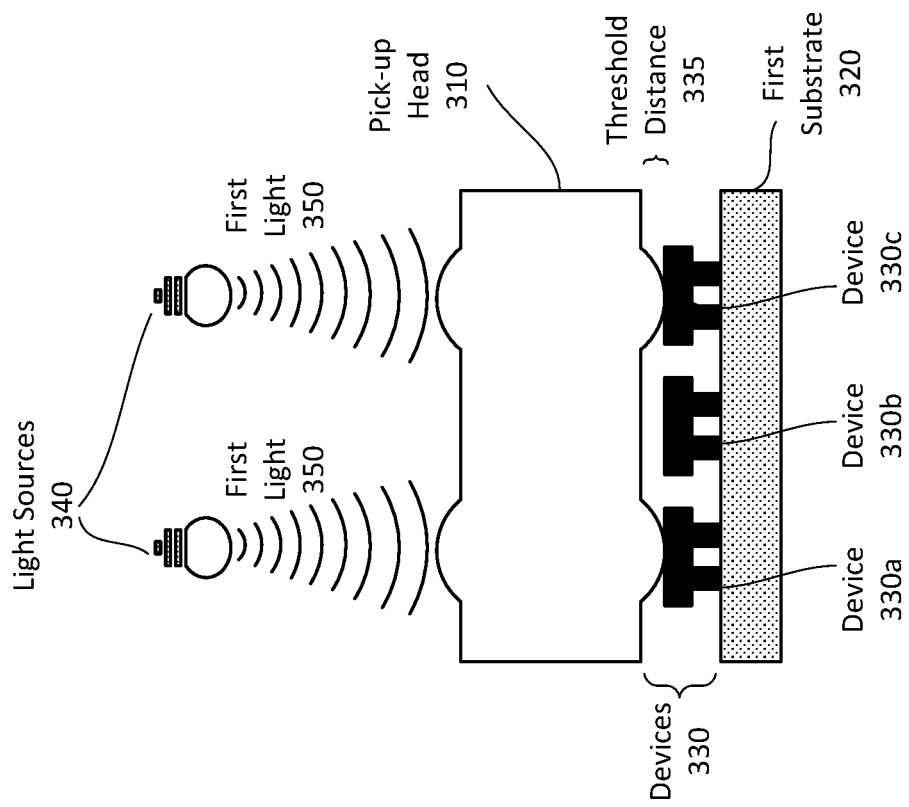
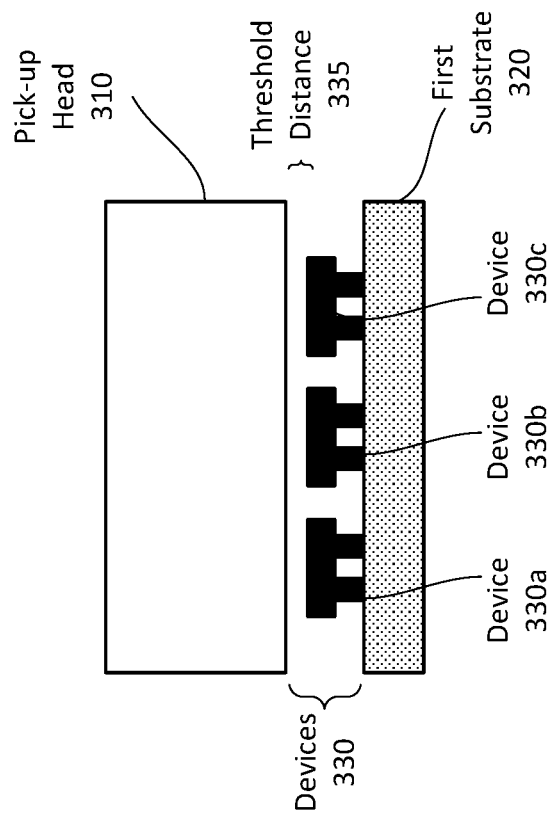
Fig. 3B
Fig. 3A

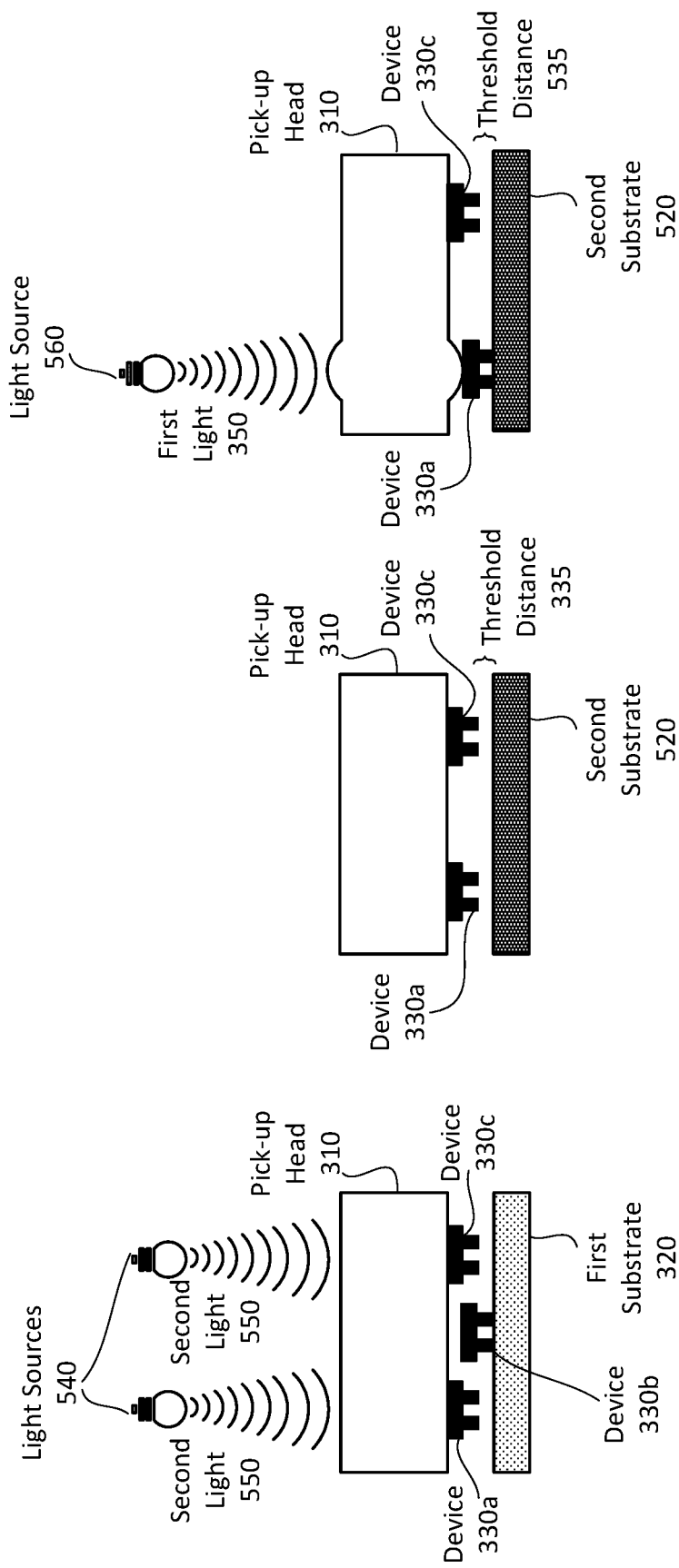

LIQUID CRYSTALLINE ELASTOMER FOR PICK AND PLACE OF SEMICONDUCTOR DEVICES

BACKGROUND

The present disclosure relates to manufacture of small display elements that are transferred from an initial substrate to a receiving substrate using a pick and place transfer process.

To populate a display with very small electronic devices, such as micro LEDs (μLEDs), there may be a need to transfer the devices from a native substrate on which they have been manufactured or a temporary carrier substrate to a target substrate that forms part of the display. The transfer may be performed by tools capable of precisely manipulating the devices, including picking, translating, aligning, and placing. Pick-up heads are one such tools for fabrication.

SUMMARY

Embodiments relate to a pick-up head including a polymeric material that undergoes a reversible shape change. In particular, the pick-up head comprises a liquid crystalline elastomer (LCE) material that undergoes a reversible expansion when exposed to a light of a first frequency. The LCE contracts when exposed to a light of a second frequency. An elastomeric LCE material provides the large adhesive forces for a pick-up head. The pick-up head further includes one or more light sources that emit light of the first frequency and light of the second frequency.

Embodiments also relate to performing pick-and-place by selectively irradiating parts of the LCE to cause expansion and contraction to pick and place a device, respectively. The LCE of the pick-up head is expanded by a light of the first frequency of light to attach the device from a first substrate. After attaching the device to a second substrate, the LCE is contracted by a light of the second frequency to detach the device from the pick-up head.

In some embodiments, the pick-up head and the device are detached from the first substrate by applying a light of the second frequency to contract the LCE, and the pick-up head and the device are attached to the second substrate by applying a light of the first frequency to expand the LCE.

BRIEF DESCRIPTION OF THE DRAWINGS

FIG. 3A is a schematic diagram of a pick-up head and a first substrate mounted with a plurality of devices, in accordance with one embodiment.

FIG. 3B is a schematic diagram of the pick-up head when exposed to a first light and the first substrate mounted with the plurality of devices, in accordance with one embodiment.

FIGS. 5A, 5B, 5C, 5D, and 5E are schematic diagrams illustrating a first process for placing a device on a second substrate using the pick-up head and one or more light sources, in accordance with one embodiment.

Figure 1:
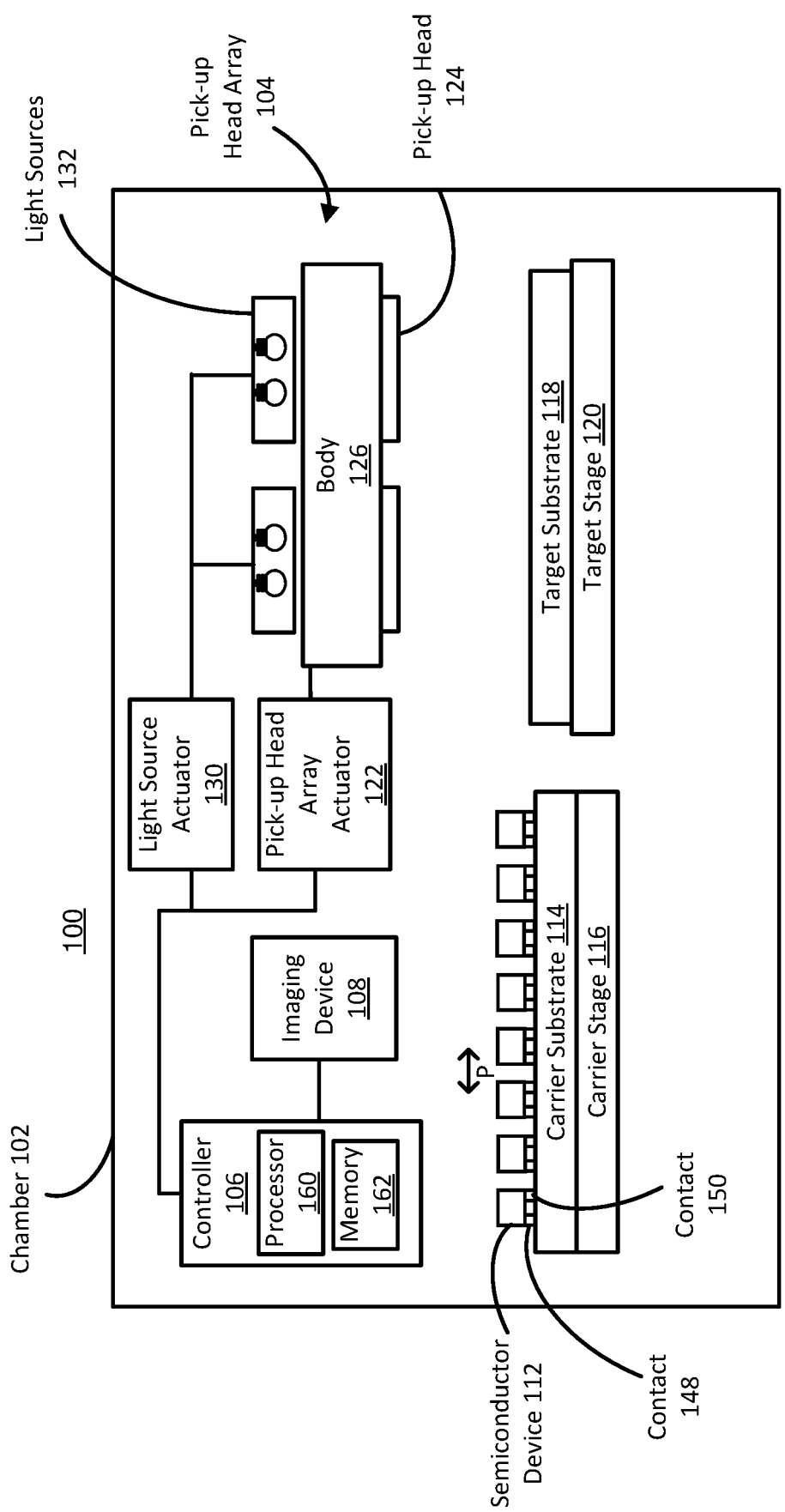
FIG. 1 is schematic diagram illustrating a display assembly system, in accordance with one embodiment.

The figures depict embodiments of the present disclosure for purposes of illustration only.

DETAILED DESCRIPTION

In some conventional processes, pick-up heads are used to pick and place devices. Such pick-up heads make contact with devices on a native substrate or a temporary carrier substrate and adheres to the device. The adhesive force between the pick-up head and the device is set to be stronger than the adhesive force between the device and the native substrate or the temporary carrier substrate, such that when the pick-up head is translated relative to the native substrate or the temporary carrier substrate, the device is removed from the native substrate or the temporary carrier substrate. The pick-up head then translates the device to a target substrate, aligns the device with a desired location on the target substrate, and places the device on the target substrate such that the device adheres to the target substrate. When the adhesive force between the target substrate and the device is stronger than the adhesive force between the pick-up head and the device, the device remains on the target substrate even when the pick-up head is lifted away from the target substrate.

In practice, the adhesive force between the target substrate and the device is increased by applying a treatment while the device is still in contact with the pick-up head. For example, the treatment can include applying thermal heat to weld any metallic connections between the device and the target substrate. However, the heat can damage small electronic devices or otherwise lead to incomplete electrical connections and/or result in short-circuits. Pick-and-place methods using conventional pick-up heads on small electronic devices can lead to incomplete electrical connections and/or result in short-circuits. Because of the small size of these devices (e.g., diameter or width smaller than 100 μm), conventional pick and place techniques using conventional pick-up heads are unsuitable.

Embodiments relate to a pick-up head that includes a liquid crystalline elastomer (LCE) that is selectively irradiated to undergo a reversible shape change for picking up or placing one or more devices (e.g., micro light emitting diodes). The pick-up head may attach to a device from a first substrate when the LCE is exposed to a first light of a first frequency, causing the LCE to expand. The pick-up head and the attached device are removed from the first substrate. The pick-up head with the device attached may then be moved to a second substrate where the device is released from the pick-up head. To facilitate the release of the device on the second substrate, the LCE may be exposed to a second light of a second frequency that causes the LCE to contract. The expansion and contraction of one or more parts of the LCE in the pick-up head as a result of selective irradiation enables precise control of the pick-and-place method. This enables picking-and-placing of very small electronic devices, including micro LEDs.

System Overview

FIG. 1 is a block diagram illustrating a display assembly system 100, in accordance one embodiment. The system 100 fabricates a display device by assembling semiconductor devices 112 from a carrier substrate 114 to a target substrate 118. In some embodiments, the semiconductor devices 112 are different color light emitting diodes (LEDs). The carrier substrate 114 (also referred to as "a first substrate" herein) may be a temporary carrier that holds the semiconductor devices 112 for pick up by the pick-up head array. The target substrate 118 (also referred to as "a second substrate" herein) may be a display substrate of a display device including control circuits for the LEDs. The system 100 places LEDs at pixel locations of the display substrate, and then bonds the LEDs to the display substrate. In some embodiments, the semiconductor devices 112 are micro LEDs having a diameter or width smaller than 100 μm, a reduced divergence of light output, and small light emitting area. In other embodiments, the semiconductor devices 112 are vertical-cavity surface-emitting lasers (VCSELs).

The system 100 may include, among other components, a chamber 102 defining an interior environment for picking and placing semiconductor devices 112 within the chamber 102. The system 100 further includes a pick-up head array 104, a controller 106, an imaging device 108, a pick-up head array actuator 122, a light source actuator 130, a carrier stage 116, and a target stage 120. The pick-up head array 104 further comprises an array of light sources 132 and at least one pick-up head 124.

The carrier stage 116 holds the carrier substrate 114 having semiconductor devices 112. The target stage 120 holds the target substrate 118 to receive some or all the semiconductor devices 112 from the carrier substrate 114.

The controller 106 is coupled to the imaging device 108, the pick-up head array 104 via the pick-up head array actuator 122, and the array of light sources 132 via the light source actuator 130, and controls the operation of these components. For example, the controller 106 causes the light source actuator 130 to move and turn on/off the array of light sources 132. The controller 106 further controls the pick-up head array actuators 122 to cause the pick-up head array 104 to pick up one or more semiconductor devices 112 located on a carrier substrate 114, and place the one or more semiconductor devices on the target substrate 118. In some embodiments, the controller includes a processor 160 and a memory 162. The memory 162 may be a non-transitory computer-readable storage medium storing instructions that when executed by the processor 160 causes the processor 160 to perform the functionality discussed herein, such as by controlling the other components of the system 100. In some embodiments, the controller 106 may include an application specific integrated circuit (ASIC), field programmable gate array (FPGA), or other type of processing circuitry.

The pick-up head array 104 comprises a body 126 and at least one pick-up head 124 at the bottom of the body 126. The body 126 has sufficient strength and rigidity to support the pick-up heads. The body 126 may also be transparent to let light pass through. The pick-up head array 104 is made of transparent material that enables light from the light sources 132 to pass through to the pick-up head 124. Each pick-up head 124 comprises a material capable of undergoing a reversible shape change when exposed to particular frequencies of electromagnetic radiation. That is, when exposed to a first frequency, or first range of frequencies, the material undergoes a reversible expansion. When exposed to a second frequency, or a second range of frequencies, the material contracts or otherwise reverses the expansion. In a particular embodiment, each pick-up head comprises a LCE. The properties and functionality of the material capable of undergoing a reversible shape change is discussed in greater detail in relation to FIGS. 2A-2B.

Although the array of light sources 132 and the pick-up head array 104 are illustrated in FIG. 1 as separate components, the array of light sources 132 may be fixed to or be a part of the pick-up head array 104.

The light source actuator 130 moves the array of light sources 132 to line up above desired portions of a pick-up head 124. The light source actuator 130 is configured to turn on and off the array of light sources 132. The array of light sources 132 irradiates the desired portions of the pick-up head 124 with electromagnetic radiation of desired frequencies, referred to herein as selective irradiation. That is, portions of the pick-up head are irradiated with a frequency of light and other portions or the pick-up head are not irradiated. The irradiation causes the reversible shape change in the irradiated portions of the material comprised within the pick-up head 124. The resulting pick-up head 124 has some portions that are expanded, and other portions that are not expanded (i.e., remain in a contracted state). In one embodiment, each light source in the array of light sources 132 produces one frequency or a range of frequencies of electromagnetic radiation (e.g., one color of light). In another embodiment, each light source in the array of light sources 132 is capable of producing multiple different frequencies of electromagnetic radiation (e.g., multiple colors of light).

The irradiated portions of the pick-up head 124 are expanded or contracted to selectively pick and place the semiconductor devices 112. The semiconductor devices 112 on the carrier substrate 114 are separated by a pitch P. In some embodiments, the pick-up head 124 is selectively irradiated by the light sources within the array of light sources 132 at the same pitch P to pick up multiple semiconductor devices 112. In another embodiment, the pick-up head 124 is selectively irradiated by the light sources within the array of light sources 132 at a multiple of the pitch P to pick up a subset of the semiconductor devices 112 (e.g., pick up every other semiconductor device 112).

The light source actuator 130 is an electro-mechanical component that causes movement of the array of light sources 132 in response to control signals from the controller 106. For example, the light source actuator 130 may align the array of light sources 132 with desired selective portions of the pick-up head 124 for irradiation. In some embodiments, the light source actuator 130 can move individual light sources or subsets of light sources within the array of light sources 132. In some embodiments, the light source actuator 130 moves the array of light sources 132 with multiple degrees of freedom (DoF) to support the alignments and movements of the array of light sources 132. For example, the light source actuator 130 may move the array of light sources 132 with three degrees of freedom including up and down, left and right, and forward and back. In another example, the light source actuator 130 moves the array of light sources 132 with six degrees of freedom. In some embodiments, the light source actuator 130 may include a rotating motor, a linear motor, and/or a hydraulic cylinder.

The pick-up head array 104 includes a plurality of pick-up heads 124. Each pick-up head 124 can pick up one or more semiconductor devices 112 from the carrier substrate 114, and place the semiconductor device 112 on the target substrate 118. In some embodiments, each pick-up head 124 further includes polymer (e.g., a silicone layer) (not shown)

on its bottom face that adheres with the semiconductor devices 112. The system 100 may include various types of pick-up heads that support selective, parallel placement of multiple semiconductor devices 112.

After picking up a semiconductor device 112, the pick-up head 124 is aligned with the target substrate 118 to place the semiconductor device 112 at target locations on the target substrate 118.

The pick-up head array actuator 122 is an electro-mechanical component that controls the movement of the pick-up head array 104 based on control signals from the controller 106. For example, the pick-up head array actuator 122 may move the pick-up head array 104, or individual pick-up heads 124, with three degrees of freedom including up and down, left and right, and forward and back. In some embodiments, the pick-up head array actuator 122 may include a rotating motor, a linear motor, and/or a hydraulic cylinder.

The imaging device 108 facilitates a visual alignment for semiconductor device pick-up from the carrier substrate 114 and semiconductor device placement on the target substrate 118. For example, the imaging device 108 generates images of the pick-up head array 104 and the carrier substrate 114, and provides the images to the controller 106. The imaging device 108 may generate images of the expanded and contracted portions of the pick-up head. The controller 106 aligns the one or more pick-up heads 124 of the pick-up head array 104 with the carrier substrate 114 based on the images, and picks up one or more semiconductor devices 112 mounted on the carrier substrate 114. In one embodiment, the controller 106 aligns the expanded portions of each pick-up head 124 with the semiconductor devices 112 on the substrate in order to pick up a desired subset of the semiconductor devices 112. In another embodiment, the pick-up head array 104 is aligned above the semiconductor devices 112 on the carrier substrate 114 and subsequently selectively irradiated by the array of light sources 132. In another example, the imaging device 108 generates images of the one or more pick-up heads 124 of the pick-up head array 104 and the target substrate 118, and provides the images to the controller 106. The controller 106 aligns the one or more pick-up heads 124 with the display substrate 118 based on the images, and places the semiconductor devices 112 attached to the one or more pick-up heads 124 on the display substrate 118.

In some embodiments, the imaging device 108 is an environmental scanning electron microscope (ESEM) to provide images without specimen coating. The chamber 102 is an ESEM chamber including a high-pressure atmosphere of water vapor. The use of an SEM is advantageous for providing visualization in connection with picking and place small semiconductor device, such as micro LEDs. In various embodiments, other types of imaging devices may be used to facilitate the alignments. In some embodiments, the system 100 may include multiple imaging devices, such as an imaging device pointed at the carrier substrate 114, an imaging device pointed at the target substrate 118, and/or an imaging device pointed at the elastomer solution holder 140.

In some embodiments, the carrier stage 116 and/or target stage 120 may be adjusted to facilitate precision alignment with the pick-up head array 104. For example, the carrier stage 116 and/or target stage 120 may include three degrees of freedom. The degrees of freedom may include left and right, backward and forward, and a yaw rotational degree of freedom. The carrier substrate 114 is moved with the carrier stage 116, and the display substrate 118 is moved with the target stage 120.

The system 100 may include one or more carrier substrates 114. For example, different carrier substrates 114 may carry different color LEDs. A carrier substrate 114 may hold singulated semiconductor devices 112 for transfer to the display substrate 118. The system 100 may further include one or more target substrates 118. In some embodiments, such as when the target substrate 118 is a display substrate for receiving the semiconductor devices 112, the target stage 120 includes a heater for thermal compression (TC) bonding of electrical contacts 148 and 150 of the semiconductor devices 112 to the display substrate 118 subsequent to placement of the semiconductor devices 112 on the display substrate 118 by the pick-up head array 104.

In some embodiments, the system 100 includes up/down inspection cameras. Alternatively, for the higher accuracy, the pick-up head array 104 may be mounted to a modified wafer aligner. For nano-placement accuracy, a smaller working/movement distance may be advantageous. In some embodiments, pick-up head array 104 provides a massively parallel pick and place operation, reducing the time for assembly and therefore reducing manufacturing costs.

In some embodiments, the system 100 includes multiple pick-up head arrays 104 each positioned at a separate station. Each station may be dedicated to the pick and place of a particular color LED, such as a green station for green LEDs, a red station for red LEDs, and a blue station for blue LEDs, etc.

In some embodiments, the semiconductor devices 112 are singulated on the carrier substrate 114, such as by a laser or mechanical dicer, or via an etching process. Multiple semiconductor devices 112 may be fabricated on a native substrate and singulated on the carrier substrate 114. In some embodiments, a laser beam is directed through the carrier substrate 114 to perform the singulation. In some embodiments, the carrier substrate 114 includes a carrier tape or other adhesive layer to hold the semiconductor devices 112 in place with an adhesion force. A laser beam or other treatment reduces the adhesion force to facilitate pick up of the semiconductor devices 112 by the pick-up head array 104.

Figure 2B:
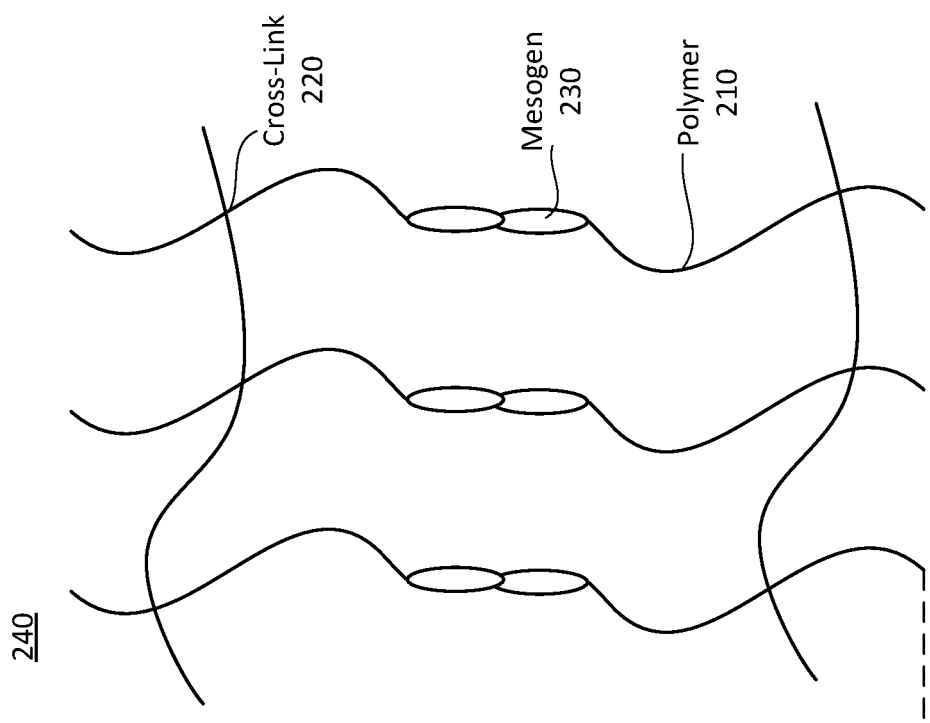
FIG. 2B is a schematic diagram illustrating the LCE in an expanded phase, in accordance with one embodiment.
Figure 2A:
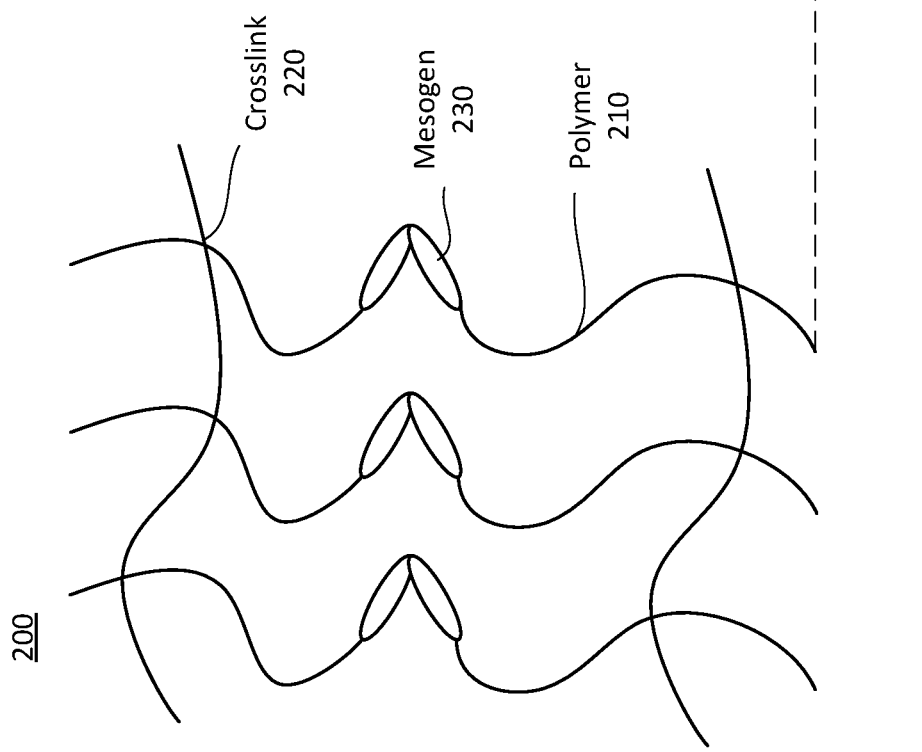
FIG. 2A is a schematic diagram illustrating a liquid crystalline elastomer (LCE) in a contracted phase, in accordance with one embodiment.

FIG. 2A is a schematic diagram illustrating a LCE in a contracted phase 200, in accordance with one embodiment. While in the embodiment shown in FIGS. 2A and 2B are of a LCE, in other embodiments, the LCE can be any material capable of undergoing a reversible shape change in response to radiation. In some embodiments, the material may be another type of liquid crystal, in particular, a liquid crystal comprising polymeric components. The LCE in the contracted phase 200 shown in the schematic in FIG. 2A comprises a plurality of polymers 210, the plurality of crosslinks 220 connecting two or more polymers 210, and a plurality mesogens 230, which are connected to at least one polymer 210.

The polymers 210 are polymeric components that have elasticity. In some embodiments, the polymers 210 are elastomers. For example, the polymer 210 can be polydimethylsiloxane (PDMS), polysiloxane, polyurethane, or another polymeric compound. It is desirable to have polymers 210 with a relatively low Young's Modulus. In particular, the polymers 210 may have a Young's Modulus less than 100 MPa, 10 MPa, or 1 MPa.

The crosslinks 220 are each a bond that connects two or more polymers 210 to one another. In some embodiments, the crosslinks 220 are relatively weak intermolecular bonds. In another embodiment, the crosslinks 220 are oligomeric chains connecting the polymers 210. In other embodiments, some or all of the crosslinks 220 are covalent bonds or other such chemical bonds. Not all polymers 210 may be crosslinked by crosslinks 220. That is, the polymers 210 may be lightly crosslinked, such that only a fraction of the polymers 210 are connected via crosslinks 220.

The mesogens 230 are chemical moiety capable of self-organizing into one or more liquid crystalline phases within the LCE. In particular, the mesogens 230 self-organize to be oriented in one or more particular directions. The mesogens 230 may be monomers, oligomers, or polymers. In some embodiments, the mesogens 230 are a subset of the larger chain of the polymers 210 (e.g., main chain of the LCE). In other embodiments, the mesogens 230 are a side-group of the polymers 210 (e.g., side chain of the LCE). In one embodiment, the mesogens 230 are azobenzene.

The LCE is in a contracted phase 200 in the schematic in FIG. 2A. In particular, the contracted phase 200 is a non-expanded phase, which may also be called a first phase. In some embodiments, mesogens 230 in the contracted phase 200 self-organize such that the long axis of the mesogen is oriented about a particular direction. In the embodiment depicted, the mesogens 230 in the contracted phase 200 organize into a first isomer. As depicted in FIG. 2A, the first isomer is a bent-like isomer formed by the mesogens 230, contracting the length of the LCE. While the schematic of contracted phase 200 is depicted in two-dimensions with the polymers 210 oriented in parallel, the LCE is a three-dimensional material. In a real three-dimensional material, the contracted phase 200 may be anisotropic.

To attain the contracted phase 200, the LCE may be subjected to conditions to produce the contracted phase 200. The conditions may differ based on the particular composition of the LCE and may include a specific temperature range, mechanical processing, and/or electromagnetic radiation. That is, the contracted phase 200 may be induced in the mesogens 230 by electromagnetic radiation, photo-alignment, shear-alignment, mechanical alignment, or some combination thereof, depending on the material composition of the LCE. The shear-alignment may be imposed by extrusion, direct ink writing, reel-to-reel processing, rolling, or some combination thereof. The electromagnetic radiation may include a range of frequencies of electromagnetic radiation. Additionally, the contracted phase 200 may only be stable within a certain temperature range.

In one embodiment, the LCE is an azo-LCE such that the polymers 210 comprise azobenzene groups and the mesogens 230 are the azobenzene monomers. In this example, the first isomer of the mesogens 230 in the contracted phase 200 is the cis-azobenzene isomer. In the cis-azobenzene isomer, the isomer is non-planar and forms a bent structure similar to that depicted in the schematic of the contracted phase 200. Accordingly, the azo-LCE is not expanded. The cis-azobenzene isomer in the contracted phase 200 is induced by exposing the azo-LCE to ultraviolet (UV) light of wavelengths approximately 300-400 nanometers (nm).

FIG. 2B is a schematic diagram illustrating the LCE in an expanded phase 240, in accordance with one embodiment. The LCE in the expanded phase 240 comprises the same components as that of the contracted phase: the polymers 210, the crosslinks 220, and the mesogens 230. The LCE undergoes a reversible shape change to alter from the contracted phase 200 to the expanded phase 240. The LCE can reversibly alter from the expanded phase 240 to the contracted phase 200.

As depicted in FIG. 2B, the expanded phase 240 is phase in which the mesogens 230 are expanded. In some embodiments, mesogens 230 in the expanded phase 240 self-organize such that the long axis of the mesogen is oriented about a second particular direction, different from the particular direction of the contracted phase 200. In the embodiment depicted, the mesogens 230 in the expanded phase 240 organize into a second isomer. As depicted, the second isomer is a uniaxial isomer formed by the mesogens 230. The second isomer of the expanded phase 240 expands the LCE by a length change 250 as compared to the contracted phase 200. While the schematic of expanded phase 240 is depicted in two-dimensions with the polymers 210 oriented in parallel, it is noted that the LCE is a three-dimensional material. In a real three-dimensional material, the expanded phase 240 may be anisotropic.

To attain the expanded phase 240, the LCE may be subjected to conditions to produce the expanded phase 240. The conditions may differ based on the particular composition of the LCE and may include a specific temperature range, mechanical processing, and/or electromagnetic radiation. The conditions to produce the expanded phase 240 are different in at least one aspect from the conditions to produce the contracted phase 200. That is, the expanded phase 240 may be induced in the mesogens 230 by electromagnetic radiation, photo-alignment, shear-alignment, mechanical alignment, or some combination thereof, depending on the material composition of the LCE. The shear-alignment may be imposed by extrusion, direct ink writing, reel-to-reel processing, rolling, or some combination thereof. The electromagnetic radiation may include a range of frequencies of electromagnetic radiation. Additionally, the expanded phase 240 may only be stable within a certain temperature range.

Returning to the example wherein the LCE is an azo-LCE, the expanded phase 240 comprises a different isomer of the azobenzene monomers. The second isomer of the mesogens 230 in the expanded phase 240 is the trans-azobenzene isomer. In the trans-azobenzene isomer, the isomer is planar and forms a straight, uniaxial structure similar to that depicted in the schematic of the expanded phase 240. Accordingly, the azo-LCE is expanded. The trans-azobenzene isomer in the expanded phase 240 can be induced by two methods. First, the trans-azobenzene isomer is attained when the azo-LCE is exposed to electromagnetic radiation of visible frequencies, in particular, a wavelength greater than or equal to 450 nm. Second, the trans-azobenzene isomer is attained when the azo-LCE is heated to a temperature approaching a phase transition temperature, wherein the phase transition temperature is the temperature at which the liquid crystalline phase liquefies.

As compared to the contracted phase 200, the expanded phase 240 has a length change 250. The length change 250 is respective to an individual molecule (e.g. full length of polymer 210 and mesogen 230) in the LCE. In a macroscopic three-dimensional LCE material the length change 250 occurs for each molecule when the material undergoes a phase transformation from the contracted phase 200 to the expanded phase 240, resulting in an expansion of the material. The expansion may be anisotropic.

Figure 2C:
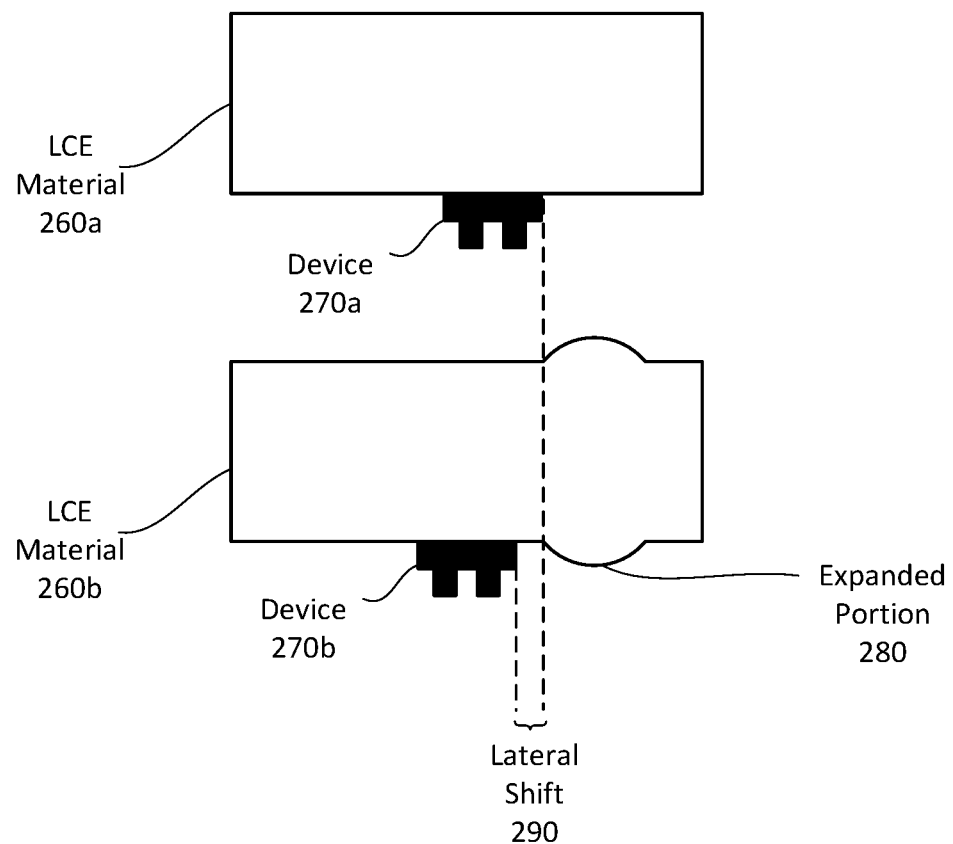
FIG. 2C is a schematic diagram showing a lateral shift caused by anisotropic expansion of the LCE, according to one embodiment.

FIG. 2C is a schematic diagram showing a lateral shift 290 caused by anisotropic expansion of the LCE, according to one embodiment. FIG. 2C shows an LCE material 260a and an attached device 270a in an un-expanded state and an LCE material 260b and an attached device 270b in an expanded state (collectively referred to as the LCE material 260 and the device 270), where an expanded portion 280 of the LCE material 260b has undergone an anisotropic photoisomerization. In the embodiment depicted, the anisotropic photoisomerization has caused a lateral shift 290 in the location of the device 270b on the LCE material 260b with respect to the device 270a on the LCE material 260a. The lateral shift 290 can be used in pick-and-place to align one or more devices for placement on a substrate. In particular, the lateral shift caused by anisotropic photoisomerization is useful for precision when distances between devices are small.

There are several methods for configuring the anisotropic photoisomerization of the LCE molecules within the LCE material 260. In one embodiment, shear alignment is performed during the manufacture of the LCE material 260 to align some of the polymer chains 210 and mesogens 230 in a preferential direction. In some embodiments, polarized light is used to induce an anisotropic photoisomerization in the LCE material 260. The incidence of polarized light causes isomerization of the mesogens 230 in certain orientations to absorb the light and isomerize into the expanded phase. Further, the direction of the incident polarized light can be controlled to enable selective position correction in one or more dimensions.

FIG. 3A is a schematic diagram of a pick-up head 310 and a first substrate 320 mounted with a plurality of devices 330, in accordance with one embodiment. Some components to the system are omitted in FIG. 3A for the sake of simplicity.

The pick-up head 310 is a device capable of contacting an object and adhering to the object. In particular, the object may be one or more of the devices 330. The pick-up head 310 includes a material capable of undergoing a reversible shape change, as described in relation to FIGS. 2A and 2B. In a one embodiment, the pick-up head comprises a LCE capable of undergoing a reversible phase change when exposed to electromagnetic radiation of particular frequencies. The LCE is included at least within or at the bottom of the pick-up head 310 (e.g., the face of the pick-up head 310 facing the devices 330). In one embodiment, the pick-up head 310 comprises one continuous component of LCE that spans the bottom of the pick-up head 310. In another embodiment, the pick-up head 310 comprises a plurality of discrete LCE components in a particular array over the bottom of the pick-up head 310, the array having a spacing that is used to pick up devices 330 (e.g., the pitch P of FIG. 1). The pick-up head 310 may comprise components in addition to the LCE. The pick-up head 310 may be one of the pick-up heads 124 as described in relation to FIG. 1.

The first substrate 320 carries a device 330a, a device 330b, and a device 330c (collectively referred to as the "devices 330" or individually also as "device 330"). The first substrate 320 may be a native substrate where the devices 330 are fabricated through a semiconductor fabrication process or a carrier substrate for the devices 330 where the devices 330 are moved for transport over a distance. The devices 330 are semiconductor devices, and may more specifically, be a plurality of LEDs. In one embodiment, the devices 330 are all the same type of device. In another embodiment, the devices 330 differ from one another. For example, the device 330a may be a red LED, the device 330b may be a blue LED, and the device 330c may be a green LED. The first substrate 320 may be the carrier substrate 114 and the devices 330 may be the devices 112 described in relation to FIG. 1.

The pick-up head 310 is aligned above the plurality of devices 330 of the first substrate 320. In particular, the pick-up head 310 is brought within a threshold distance 335 above the devices 330. In one embodiment, the threshold distance 335 corresponds to a thickness change in the LCE by expansion that is sufficient to come in contact and attach the devices 330 onto the pick-up head 310. The threshold distance 335 may be determined in a calibration process associated with the pick-up head 310.

FIG. 3B is a schematic diagram of the pick-up head 310 when exposed to a first light 350 and the first substrate 320 mounted with the plurality of devices 330, in accordance with one embodiment. The first light 350 is emitted by light sources 340.

The light sources 340 are configured to emit at least the first light 350. In some embodiments, the light sources 340 may be able to emit additional lights. The light sources 340 may be light emitting diodes (LEDs) (separate from the devices 330), laser beam generator, or any other source of electromagnetic radiation sources. The light sources may be aligned to irradiate particular, discrete portions of the pick-up head 310. The light sources 340 may be one or more light sources. The light sources 340 may be the same as the array of light sources 132 of FIG. 1 or otherwise be a subset of light sources within the array of light sources 132.

The first light 350 is electromagnetic radiation that causes the LCE of the pick-up head 310 to expand. The first light 350 is of a first frequency, or range of frequencies, that cause the LCE of the pick-up head 310 to undergo a reversible expansion. The range of frequencies may be open (e.g., specified as above or below a particular frequency). The first light 350 may be visible, UV, or infrared (IR) light, or radiation of another portion of the electromagnetic spectrum. In some instances, the first light 350 may be specified in terms of wavelength instead of frequency.

In some embodiments, the pick-up head 310 is exposed to heat in addition to or in lieu of the first light 350. Some LCEs undergo a spontaneous shape change resulting in an expansion when heated above a threshold temperature. For example, the azo-LCE discussed as an example in relation to FIGS. 2A and 2B undergoes a phase change corresponding to an expanded phase when heated close to the phase transition temperature of the azo-LCE. In some embodiments, the LCE, such as the azo-LCE, are irradiated with both heat and the first light 350. In other embodiments, the first light 350 causes indirect heating of the LCE in the pick-up head 310.

As the pick-up head 310 is selectively irradiated by the first light 350 from the light sources 340, the selectively irradiated portions of the LCE of the pick-up head 310 expand. In the embodiment depicted in FIG. 3, the expansion is anisotropic, resulting in bulges protruding from the surfaces of the irradiated portions of the LCE of the pick-up head 310. Furthermore, the expanded LCE conforms to a top surface of each device 330, forming an adhesive bond between the each of device 330a and 330c and the pick-up head 310. When adhered to the pick-up head 310, the device 330a, 330c, has been "picked" by the pick-up head 310. The adhesive bond between the device 330a, 330c and the pick-up head 310 is stronger than bonds formed between the device 330a, 330c and the first substrate 320. That is, when the pick-up head 310 is translated with respect to the first substrate 320, the device 330a, 330c will remain attached to the pick-up head 310 and be removed from the first substrate 320.

The use of the threshold distance 335 mitigates possible damage to the devices 330 from the expansion of the pick-up head 310. That is, the pick-up head 310 does not substantially expand into the devices and therefore does not crush the potentially delicate devices 330. Furthermore, the use of the LCE in the pick-up head 310 further mitigates possible damage to the devices 330. The LCE is readily deformable and conforms to the devices 330, creating an adhesive bond with the devices 330 instead of crushing the devices 330 through applying excessive pressure onto the devices 330.

Additionally, the selective irradiation and resulting expansion of the LCE of the pick-up head 310 via the light sources 340 enable precision in forming adhesive bonds with the devices 330. For example, as shown in FIG. 3B, the portions of the pick-up head 310 above the device 330*a* and the device 330*c* are irradiated. These portions thereby expand and adhere to the devices 330*a*, 330*c*. However, the portion of the pick-up head 310 above the device 330*b* is not irradiated. This portion of the pick-up head 310 does not expand and the device 330*b* is not adhered to the pick-up head 310. The ability to selectively irradiate the pick-up head 310 to adhere to select devices (e.g., devices 330*a*, 330*c*) while not disturbing other devices (e.g., device 330*b*) provides an improves method for micro-fabrication. The pick-up head 310 comprising the LCE can be scaled for micro-fabrication and provide the precision and accuracy to pick devices, without damaging the picked devices or surrounding devices.

Figure 4:
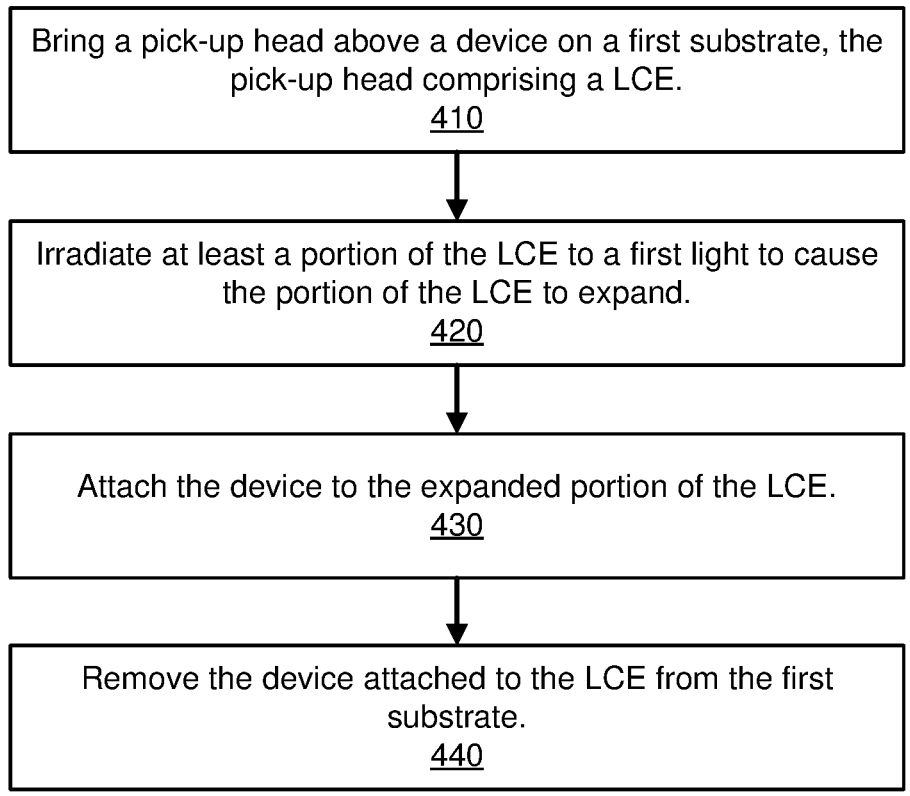
FIG. 4 is a flowchart illustrating a process for picking a device with a pick-up head, the pick-up head comprising a LCE, in accordance with one embodiment.

FIG. 4 is a flowchart illustrating a process for picking a device with a pick-up head, the pick-up head comprising a LCE, in accordance with one embodiment. The process of FIG. 3A-3B may be performed by the system 100 of FIG. 1. The pick-up head may be the pick-up head 124 of FIG. 1 or the pick-up head 310 of FIGS. 3A-3B. The device may be one of the semiconductor devices 112 of FIG. 1 or one of the devices 330 of FIGS. 3A-3B.

A pick-up head is brought 410 above a device on a first substrate, the pick-up head comprising a LCE. The first substrate may be the carrier substrate 114 of FIG. 1 or the first substrate 320 of FIGS. 3A-3B. The LCE is capable of undergoing a reversible shape change and may be one of the materials described above in relation to FIGS. 2A-2B. The configuration of the pick-up head when it is brought 410 above the device on the first substrate may be similar to the embodiment shown in FIG. 3A.

At least a portion of the LCE to a first light is irradiated 420 to cause the portion of the LCE to expand. The expansion is one aspect of the reversible shape transformation and may be anisotropic. The irradiation may include heat or cause indirect heating of the LCE. The first light may be the first light 350 of FIG. 3B. FIG. 3B shows one embodiment of the pick-up head 310 expanded when parts of the LCE of the pick-up head 310 are irradiated 420 by a first light 350 from light sources 340.

The device is attached 430 to the expanded portion of the LCE. The attachment 430 occurs via an adhesive force between the device and the LCE of the pick-up head. In some embodiments, the attaching 430 occurs as the LCE expands when irradiated 420. In other embodiments, the attaching 430 may include additional treatments to cause the pick-up head to attach to the device. The pick-up head may comprise a layer between the LCE and the device to be attached 430. FIG. 3B shows one embodiment of the device 330*a*, 330*c* attached 430 to the LCE of the pick-up head 310.

The device attached to the LCE is removed 440 from the first substrate. The adhesive force between the device and the LCE of the pick-up head is stronger than the force between the device and the first substrate. The device can be removed 440 from the first substrate by translating the pick-up head with respect to the first substrate (e.g., lifting the pick-up head away from the first substrate). Such an embodiment is discussed in greater detail in relation to FIG. 6A. In another embodiment, a relative translation of the LCE with respect to the first substrate to remove 440 the device occurs by reversing the shape transformation of the LCE. One such an embodiment is discussed in greater detail in relation to FIG. 5A.

The processes described above with reference to FIG. 4 may be performed in a different order than described herein. For example, bringing 410 a pick-up head above a device on a first substrate, the pick-up head comprising an LCE and irradiating 420 at least a portion of the LCE to a first light to cause the portion of the LCE to expand may be performed in parallel. In another example, the irradiating 420 may occur prior to the bringing 410. In another example, the irradiating 420 may occur in parallel to attaching 430 the device to the expanded portion of the LCE, such that the expansion caused by the irradiating 420 is what causes the attaching 430. In another example, an additional step of irradiating the portion of the LCE to a second light to cause the portion of the LCE to contract may be performed prior to or in parallel with the removing 440 the device attached to the LCE from the first substrate. Further, some processes in FIG. 4 may be omitted or additional processes may be added. The process described above in reference to FIG. 4 may be performed by a system with multiple components, in particular a system for fabrication, such as the system 100 of FIG. 1.

FIGS. 5A-5E are schematic diagrams illustrating a first process for placing a device 330*a* on a second substrate 520 using the pick-up head 310 and one or more light sources 540, 560, 570, in accordance with one embodiment. The first process described in relation to FIGS. 5A-5E can be a continuation of the process described in relation to FIGS. 3A-3B and 4.

FIG. 5A is a schematic diagram illustrating removing devices 330*a*, 330*c* from a first substrate 320 using a second light 550, in accordance with one embodiment. The second light 550 is emitted from light sources 540. The schematic of FIG. 5A represents one embodiment of the removing 440 of FIG. 4.

The light sources 540 emit at least the second light 550 when operated. In some embodiments, the light sources 540 may be emit additional lights, such as the first light 350. The light sources 540 may be embodied as LEDs, lasers, or any other source of electromagnetic radiation. The light sources are aligned to irradiate particular portions of the pick-up head 310. The light sources 540 may be one or more light sources. The light sources 540 may be the same as the array of light sources 132 of FIG. 1 or otherwise be a subset of light sources within the array of light sources 132. The light sources 540 may be the same as the light sources 340 of FIG. 3B or otherwise part of the same array of light sources as the light sources 340. For example, the light source 340 and the light sources 540 may be included in the same array of light sources, such as the array of light sources 132.

The light 550 is electromagnetic radiation that causes the LCE of the pick-up head 310 to contract, or otherwise return to its not expanded state. The second light 550 is of a second frequency, or range of frequencies, that cause the LCE of the pick-up head 310 to undergo reverse the expansion undergone by exposure to the first light 350. The range of frequencies may be open (e.g., specified as above or below a particular frequency). The second light 550 may be visible, UV, or infrared (IR) light, or radiation of another portion of the electromagnetic spectrum. In some instances, the second light 550 may be specified in terms of wavelength instead of frequency.

As the pick-up head 310 is irradiated by the second light 550 from the light sources 540, the pick-up head contracts. When the pick-up head contracts, the shape change creates an upward force on the device 330*a*, 330*c*. Because the adhesive force between the device 330*a*, 330*c* and the pick-up head 310 is stronger than the adhesive force between the device 330a, 330c and the first substrate 320, when the portions of the pick-up head 310 attached to devices 330 contract upward, the device detaches from the first substrate 320. When the pick-up head 310 contracts, the contracting portions of the LCE and the devices 330 move away from the first substrate 320.

FIG. 5B is a schematic diagram illustrating aligning the pick-up head 310 above a second substrate 520, in accordance with one embodiment. In particular, the pick-up head 310 is aligned such that the bottoms of the devices 330 are within the threshold distance 335 above the second substrate 520.

The second substrate 520 is capable of holding semiconductor devices. While the second substrate 520 does not comprise any mounted devices, the second substrate 520 could have one or more devices mounted prior to the alignment of the pick-up head 310. In some embodiments, the second substrate 520 is a display substrate. In some embodiments, the second substrate 520 is the target substrate 118 of FIG. 1.

FIG. 5C is a schematic diagram illustrating the pick-up head 310 when a portion of the pick-up head 310 is irradiated by a first light 350 above the second substrate 520, according to one embodiment. The first light 350 is emitted by a light source 560. The first light 350 emitted by the light source 560 has the same properties (e.g., the same frequency or range of frequencies) as the first light 350 of FIG. 3B.

The light source 560 may be the same as the light sources 340, or otherwise has the same properties. For example, the light source 560 may be part of an array of light sources, such as the array of light sources 132, including the light sources 340 and the light sources 540. The light source 560 is aligned above a desired portion of the pick-up head 310 such that the first light 350 irradiates only the desired portion. FIG. 5C only depicts one light source 560 for simplicity. However, embodiments can include multiple light sources 560 irradiating multiple desired portions of the pick-up head.

The first light 350 causes the irradiated portion of the pick-up head 310 to expand. The expansion is reversible and has the same effects on the LCE as the expansion caused by the first light 350 in FIG. 3B. The expansion is such that the LCE expands across the threshold distance 335. The expansion of the desired portion of the LCE of the pick-up head causes the device 330a to make contact with the second substrate 520.

After the device 330a makes contact with the second substrate 520, the strength of the bond between the device 330a and the second substrate 520 may be set to be greater than the adhesive bond between the device 330a and the pick-up head 310. In some embodiments, the bond between the device 330a and the second substrate 520 is inherently stronger than the adhesive bond between the device 330a and the pick-up head 310. In some embodiments, an upper surface of the second substrate 520 is treated to strengthen the bond, such as applying a strong adhesive. In other embodiments, a treatment is applied after the device 330a makes contact with the upper surface of the second substrate 520, such as a heat treatment or other treatment to strengthen the electrical contacts between the device 330a and the second substrate 520.

In some embodiments, the contact between the device 330a and the second substrate 520 is increased relatively by decreasing the strength of the bond between the device 330a and the pick-up head 310. The strength of the bond between the device 330a and the pick-up head 310 is decreased by applying a treatment to reduce the adhesive strength of the bond. In another embodiment, the surface area of the adhesive contact is reduced, thereby reducing the strength of the adhesive contact. The surface area of the adhesive contact between the pick-up head 310 and the device 330a can be decreased by reversing the expansion of the LCE. The strength of the bond between the pick-up head 310 and the device 330a can be decreased by applying the second light 550 to contract the LCE, as discussed below in relation to FIG. 5D.

Figure 5E:
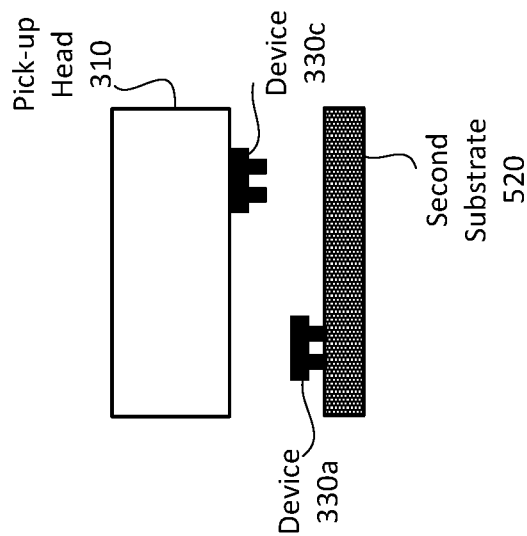
Figure 5D:
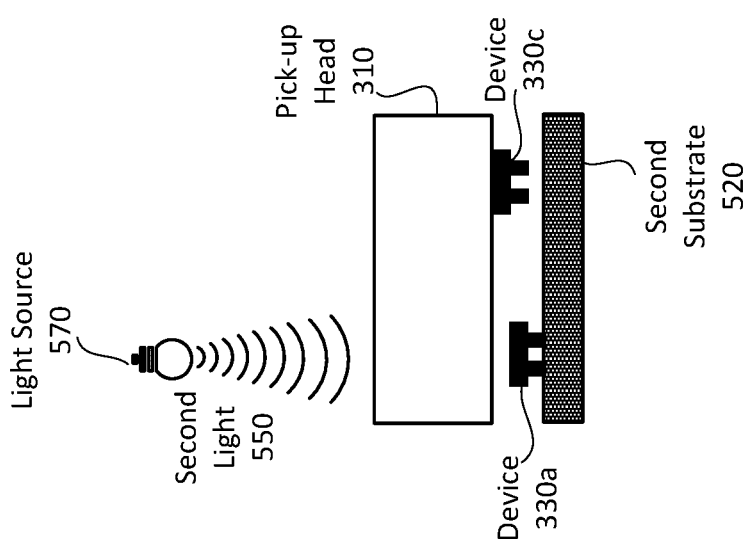

FIG. 5D is a schematic diagram illustrating the pick-up head 310 when a portion of the pick-up head 310 is irradiated by the second light 550 above the second substrate 520, according to one embodiment. The second light 550 is emitted by a light source 570. The second light 550 emitted by the light source 570 has the same properties (e.g., the same frequency or range of frequencies) as the second light 550 emitted by light sources 540 of FIG. 5A.

The light source 570 may be the same as the light sources 540, or otherwise has the same properties. For example, the light source 570 may be part of an array of light sources, such as the array of light sources 132, including the light sources 340, the light sources 540, and the light source 560. The light source 570 is aligned above a desired portion of the pick-up head 310 such that the second light 550 irradiates only the desired portion. The desired portion is the portion of the LCE above the device 330a to be placed on the second substrate 520. FIG. 5D only depicts one light source 570 for simplicity. However, embodiments can include multiple light sources 570 irradiating multiple desired portions of the pick-up head.

When the desired portion of the LCE of the pick-up head 310 is irradiated with the second light 550, the LCE contracts. In some embodiments, the contraction of the LCE reduces the adhesive force between the device 330a and the pick-up head 310. Because the device 330a is more strongly bonded to the second substrate 520 than the pick-up head, when the LCE contracts, the device 330a remains attached to the second substrate 520 and detaches from the pick-up head. The irradiation of the pick-up head 310 by the second light 550 causes the device 330a to be removed from the pick-up head 310. Accordingly, the device 330a has been placed on the second substrate 520 without causing damage to the device 330a.

The selective irradiation of the LCE of the pick-up head 310 about the device 330a in the embodiments illustrated in FIGS. 5C and 5D enables the placing of device 330a without disturbing device 330c. That is, the irradiation is precise enough to enable placing of one or more micro devices (e.g., device 33a) without damaging other micro devices (e.g., device 330c). The precision is useful for fabrication of display substrates that comprise micro devices, such as micro-LEDs.

FIG. 5E is a schematic diagram illustrating the removal of the pick-up head 310 from the second substrate 520 and the attached device 330a. When the device 330a is attached to the second substrate 520 the pick-up head 310 and the device 330c are physically translated relative to the second substrate 520. The device 330c may be placed on another substrate by the pick-up head.

FIGS. 6A-6E are schematic diagrams illustrating a second process for placing a device 330a on a second substrate 620 using the pick-up head 310 and one or more light sources 640, in accordance with one embodiment. The second process described in relation to FIGS. 6A-6E can be a continuation of the process described in relation to FIGS. 3A-3B, 4.

Figure 6C:
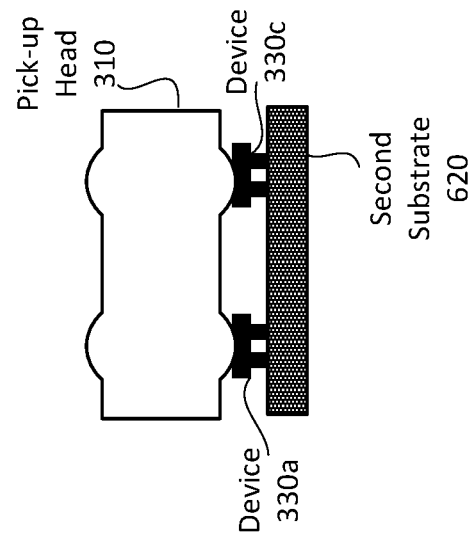
FIGS. 6A, 6B, 6C, 6D, and 6E are schematic diagrams illustrating a second process for placing a device on a second substrate using the pick-up head and one or more light sources, in accordance with one embodiment.
Figure 6B:
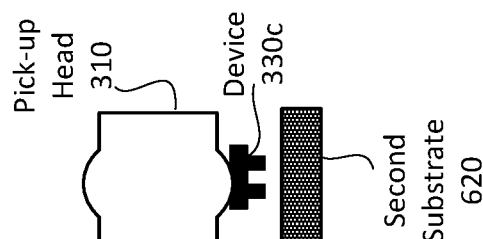
Figure 6A:
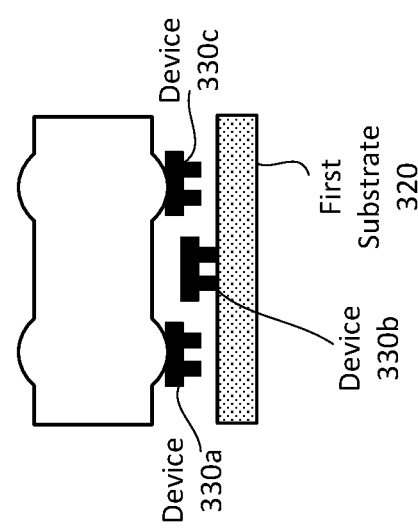

FIG. 6A is a schematic diagram illustrating removing devices 330a, 330c from a first substrate 320, in accordance with one embodiment. The schematic of FIG. 6A represents one embodiment of the removing 440 of FIG. 4.

In particular, the embodiment of FIG. 6A illustrates physically translating the pick-up head with the attached devices 330a, 330c from the first substrate 320. The substrate 320 may be moved on a stage, such as the carrier stage 116 of FIG. 1, or the pick-up head may be moved by an actuator, such as the pick-up head array actuator 122 of FIG. 1. The relative translation of the pick-up head 310 occurs while the LCE of the pick-up head 310 remains in the expanded state of the reversible phase change. The pick-up head 310 is translated leaving the device 330b undamaged on the first substrate 320.

FIG. 6B is a schematic diagram illustrating aligning the pick-up head 310 and attached devices 330a, 330c above a second substrate 620. The second substrate 620 has the same properties of the substrate 520 of FIGS. 5B-5E and is capable of supporting one or more semiconductor devices. The second substrate 620 is illustrated without any devices for simplicity, but may comprise one or more devices prior to the alignment of the pick-up head 310. The pick-up head 310 is aligned such that the device 330a is above its desired position on the second substrate 620.

FIG. 6C is a schematic diagram illustrating the devices 330a, 330c making contact with the second substrate 620. In some embodiments, the device 330c may not make contact with the second substrate 620.

When the device 330a makes physical contact with the second substrate 520, one or more treatments may be applied to the device 330a to form or strengthen the electrical contacts between the device 330a and the substrate 620. Such treatments and methods have been described in relation to FIG. 5C. The treatments are not applied to the device 330c.

Figure 6E:
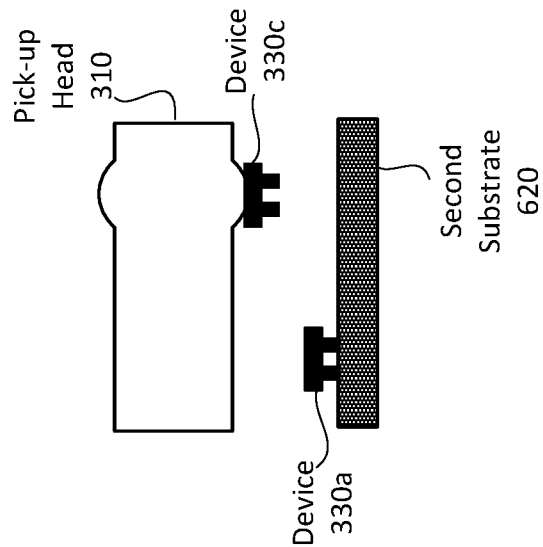
Figure 6D:
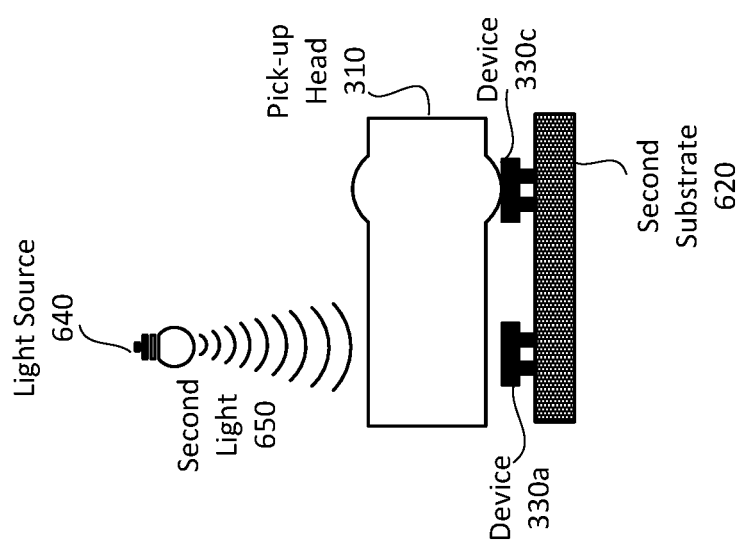

FIG. 6D is a schematic diagram illustrating the pick-up head 310 when a portion of the pick-up head 310 is irradiated by the second light 650 above the second substrate 620, according to one embodiment. The second light 650 is emitted by a light source 640. The second light 650 emitted by the light source 640 has the same properties as the second light 550 emitted by light sources 540, 570 of FIGS. 5A, 5D. That is, the same frequency or range of frequencies. The light source 640 has the same properties as the light sources 540, 570 of FIGS. 5A, 5D.

The irradiation of the portion of the LCE of the pick-up head 310 above the device 330a causes the portion of the LCE to contract. The contraction of the LCE decreases the surface area of the pick-up head 310 in contact with the device 330a and thereby decreases the strength of the adhesive bond between the pick-up head and the device 330a. The relative strength of the attachment of the device 330a to the second substrate 620 becomes stronger than the adhesive bond between the device 330a and the pick-up head 310. As previously discussed in relation to FIG. 5D and the second substrate 520, when the pick-up head contracts, the device 330a remains attached to the second substrate 620 and detaches from the pick-up head 310. The benefits of this method are also discussed in relation to FIG. 5D.

FIG. 6E is a schematic diagram illustrating the removal of the pick-up head 310 from the second substrate 620 and the attached device 330a. When the device 330a is attached to the second substrate 520 the pick-up head 310 and the device 330c are physically translated relative to the second substrate 520. The device 330c remains attached to the pick-up head 310 when the pick-up head 310 is physically translated because the adhesive bond between the device 330c and the pick-up head 310 is stronger than the bonding forces between the device 330c and the second substrate 620. The device 330c may be placed on another substrate by the pick-up head.

Micro LED Examples

Figure 7:
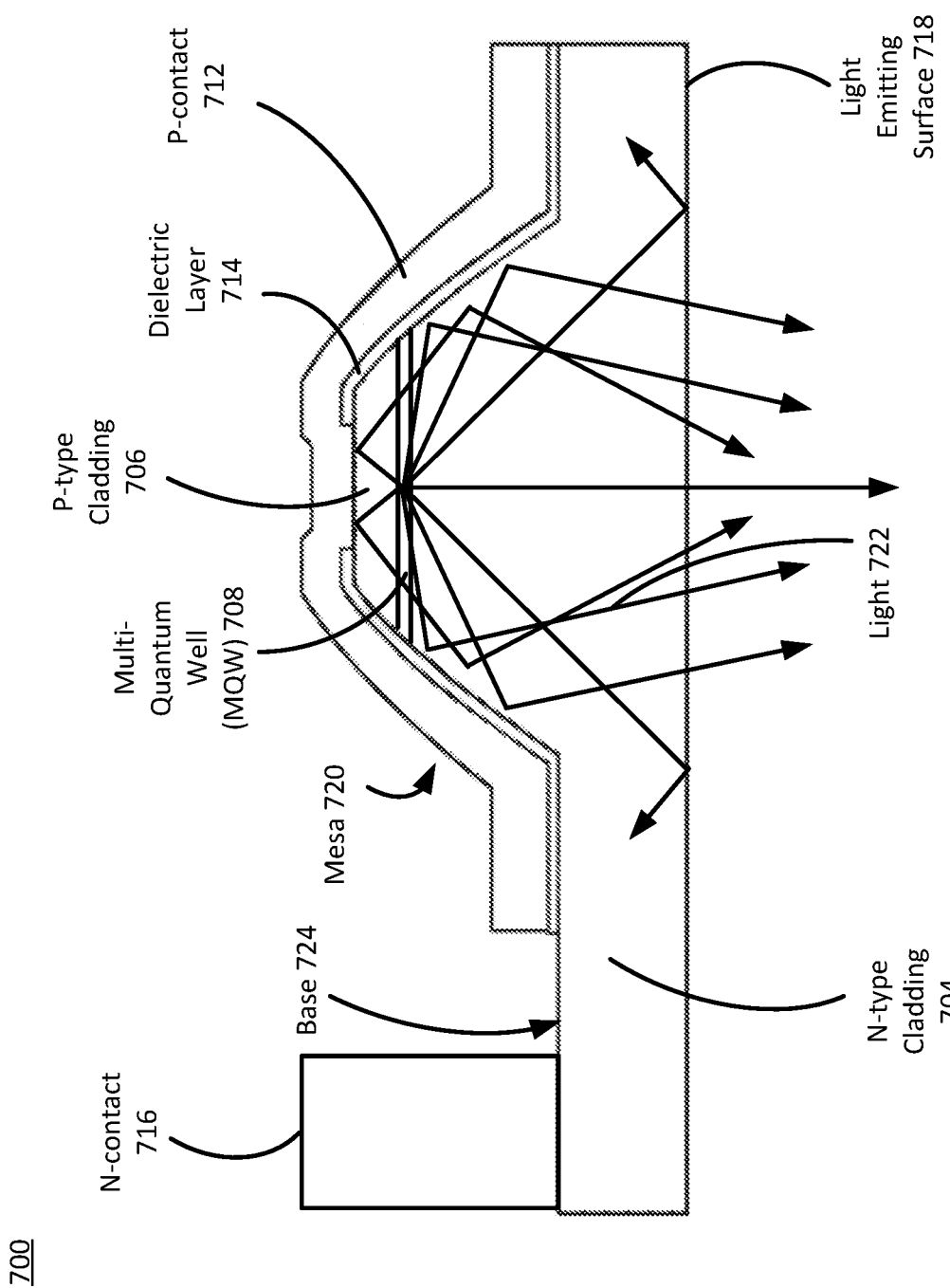
FIG. 7 is a schematic diagram illustrating a cross-sectional view of a micro light emitting diode, in accordance with one embodiment.

FIG. 7 is a schematic diagram illustrating a cross-sectional view of a micro LED 700, in accordance with one embodiment. The micro LED 700 is an example of a semiconductor device 112 on which a comfortable interface layer 146 is formed to facilitate pick and place from a carrier substrate 114 to a target substrate 118. The micro LED 700 may include, among other components, a semiconductor structure including an n-type cladding 704, a p-type cladding 706, and a multi-quantum well ("MQW") 708 between the n-type cladding 704 and the p-type cladding 706. The micro LED 700 further includes a dielectric layer 710 on the semiconductor structure, a p-contact 712 on the dielectric layer 714, and an n-contact 716 on the n-type cladding 704. The semiconductor structure is shaped, such as via an etch process, into a mesa 720 and a base 724 of the mesa 720. The p-type cladding 706 defines the top of the mesa 720, and the n-type cladding 704 defines a portion of the mesa 720 and the base 724. In some embodiments, an n-type cladding defines the top portion of the mesa 720 and a p-type cladding defines the bottom portion of the mesa 720 and the base 724. Here, the p-contact 712 is an n-contact and the n-contact 716 is a p-contact.

The MQW 708 defines an active light emitting area that is included in the structure of the mesa 720. The micro LED 700 may include one or more quantum wells. The mesa 720 may include a truncated top defined on a side opposed to a light emitting surface 718 of the micro LED 700. In some embodiments, the semiconductor structure including the n-type cladding 704, MQW 708, and p-type cladding 706 is an epitaxial structure grown on a growth substrate.

The mesa 720 may include various shapes, such as a parabolic shape with a truncated top, to form a reflective enclosure for light 722 generated within the micro LED 700. In other embodiments, the mesa 720 may include a cylindrical shape with a truncated top, or a conic shape with a truncated top, or some other light-collimating shape. The arrows show how the light 722 emitted from the MQW 708 is reflected off the p-contact 712 and internal walls of the mesa 720 toward the light emitting surface 718 at an angle sufficient for the light to escape the micro LED 700 (i.e., within a critical angle of total internal reflection). The p-contact 712 and the n-contact 716 are examples of the contacts 148, 150 of the semiconductor device 112, and electrically connect the micro LED 700, such as to a display substrate including a control circuit for the micro LED 700. The n-contact 716 is formed at the base 724, which is defined by a surface of the n-type cladding 706 opposite the light emitting surface 718. The n-contact 716 may include a conductive material that extends to the top of the mesa 720 to support the placement of the micro LED 700 on the display substrate with the p-contact 712 and the n-contact 716 bonded to the display substrate.

The micro LED 700 may include an active light emitting area defined by the MQW 708. The micro LED 700 directionalizes the light output from the MQW 708 and increases the brightness level of the light output. In particular, the p-contact 712 may be reflective for the light 722 emitted from the MQW 708. The mesa 720 and p-contact 712 cause reflection of the light 722 from the MQW 708 to form a collimated or quasi-collimated light beam emerging from the light emitting surface 718.

The mesa 720 may be formed by etching into the semiconductor structure including the n-type cladding 704, the MQW 708, and the p-type cladding 706, during wafer processing steps. The etching results in the MQW 708 being in the structure of the mesa 720, and at a particular distance to the p-contact 712 to facilitate the collimation of the light 722. In some embodiments, the MQW 708 is at a parabola focal point defined by the parabolic shape of the mesa 720. A portion of the generated light 722 is reflected at the mesa 720 to form the quasi-collimated light beam emitted from the light emitting surface 718.

In some embodiments, the feature size of the micro LED 700 (e.g., the diameter) may range from sub-micrometers to tens of micrometers (e.g., from 0.1 µm to 10 µm). The micro LED 700 may be one of many µLEDs of an array, with the pitch (e.g., spacing between micro LEDs) ranging from sub-micrometers to tens of micrometers.

The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A method comprising:
   bringing a pick-up head above a device on a first substrate, the pick-up head comprising liquid crystalline elastomer (LCE) at least in a bottom portion of the pick-up head;
   exposing at least a portion of the LCE to a first light to cause the portion of the LCE to expand;
   attaching the device to the expanded portion of the LCE; and
   removing the device attached to the LCE from the first substrate.

2. The method of claim 1, wherein exposing the at least a portion of the LCE to the first light comprises exposing, to the first light, a plurality of portions of the LCE corresponding to a plurality of devices including the device on the first subset, wherein the plurality of devices are not adjacent to each other.

3. The method of claim 1, further comprising:
   bringing the pick-up head and the attached device above a second substrate;
   causing a relative motion between the device and the second substrate to attach the device to the second substrate;
   detaching the pick-up head from the device; and
   moving the pick-up head away from the second substrate.

4. The method of claim 3, wherein the first light is of a first frequency, wherein the removing of the device from the first substrate comprises separating the pick-up head attached with the device from the first substrate, and wherein causing the relative motion comprises exposing the portion of the LCE to second light of a second frequency being different from the first frequency.

5. The method of claim 3, wherein the removing of the device from the first substrate comprises contracting the portion of the LCE by exposing the portion of the LCE to second light of a second frequency being different from the first frequency, and wherein causing the relative motion comprises exposing the portion of the LCE to the first light to expand the portion of the LCE.

6. The method of claim 5, wherein bringing the pick-up head and the attached device above the second substrate further comprises bringing the pick-up head within a threshold distance above the device on the first substrate, wherein the threshold distance corresponds to a change in thickness of the LCE sufficient for the pick-up head to come in contact with the device.

7. The method of claim 1, wherein the first substrate is mounted with a plurality of devices including the device, and wherein selective portions of the LCE including the portion of the LCE are exposed to the first light to attach a subset of the plurality devices onto the LCE.

8. The method of claim 1, wherein the pick-up head comprises an elastomeric layer between the LCE and the device.

9. The method of claim 1, wherein the device is a micro light emitting diode.

10. The method of claim 1, wherein the LCE expansion caused by the first light is anisotropic and reversible in the presence of a second light.

11. The method of claim 1, wherein bringing the pick-up head above the device on the first substrate further comprises bringing the pick-up head within a threshold distance above the device on the first substrate, wherein the threshold distance corresponds to a change in thickness of the LCE sufficient for the pick-up head to come in contact with the device.

12. The method of claim 1, wherein the LCE comprises polymeric components of one or more of polydimethylsiloxane (PDMS), polysiloxane, and polyurethane, and wherein at least some of the polymeric components are crosslinked.

13. The method of claim 1, wherein the LCE comprises mesogens of azobenzene.

14. A system for picking up and placing devices, comprising:
   a light source configured to emit a first light;
   a pick-up head comprising liquid crystalline elastomer (LCE) in a pathway of the first light, the LCE configured to have a portion of the LCE exposed to the first light attach a device on a first substrate by expanding towards the first substrate; and
   an actuator configured to move the pick-up head attached with the device away from the first substrate and toward a second substrate.

15. The system of claim 14, wherein the first light is of a first frequency, further comprising another light source configured to irradiate at least the portion of the LCE with a second light of a second frequency, wherein the second frequency causes the LCE to reverse the expansion caused by light of the first frequency.

16. The system of claim 15, wherein the LCE is configured to:
   detach the device when the LCE is expansion is reversed by the second light of the second frequency emitted by the other light source.

17. The system of claim 14, wherein the device is a micro light emitting diode.

18. The system of claim 14, wherein the LCE expansion caused by the first light is anisotropic and reversible when exposed to a second light.

19. The system of claim 14, wherein the LCE comprises polymeric components of one or more of polydimethylsiloxane (PDMS), polysiloxane, and polyurethane, and wherein at least some of the polymeric components are crosslinked.

20. The system of claim 14, wherein the LCE comprises mesogens of azobenzene.

\* \* \* \* \*